United States Patent [19]

Owen, III et al.

[11] 4,096,584
[45] Jun. 20, 1978

[54] LOW POWER/HIGH SPEED STATIC RAM

[75] Inventors: William H. Owen, III, Mountain View; Kim R. Kokkonen; Richard D. Pashley, both of Sunnyvale, all of Calif.

[73] Assignee: Intel Corporation, Santa Clara, Calif.

[21] Appl. No.: 764,031

[22] Filed: Jan. 31, 1977

[51] Int. Cl.² .............................................. G11C 11/40
[52] U.S. Cl. ............................... 365/227; 307/DIG. 5; 307/264
[58] Field of Search ............ 340/173 R, 900 MS File; 365/226, 227, 230; 307/238, DIG. 5

[56] References Cited

U.S. PATENT DOCUMENTS

| | | | |
|---|---|---|---|
| 3,703,710 | 11/1972 | Kubo et al. | 365/226 |
| 3,848,237 | 11/1974 | Geilhufe et al. | 307/DIG. 5 |
| 3,906,464 | 9/1975 | Lattin | 340/173 R |
| 3,969,708 | 7/1976 | Sonoda | 340/173 R |
| 3,995,172 | 11/1976 | Freeman et al. | 365/226 |
| 4,019,068 | 4/1977 | Bormann | 340/173 R |

Primary Examiner—Bernard Konick
Assistant Examiner—Donald McElheny
Attorney, Agent, or Firm—Blakely, Sokoloff, Taylor & Zafman

[57] ABSTRACT

An integrated circuit, metal-oxide-semiconductor (MOS) static random-access memory (RAM) with a power-down mode is described. The bistable memory cells employed in the memory include low conductivity, depletion mode transistors used as loads. "Zero" threshold voltage devices are employed on a low body-effect substrate to permit the powering-down of many circuits in the memory without affecting circuit performance. Several circuits employing these zero threshold devices are described.

10 Claims, 7 Drawing Figures

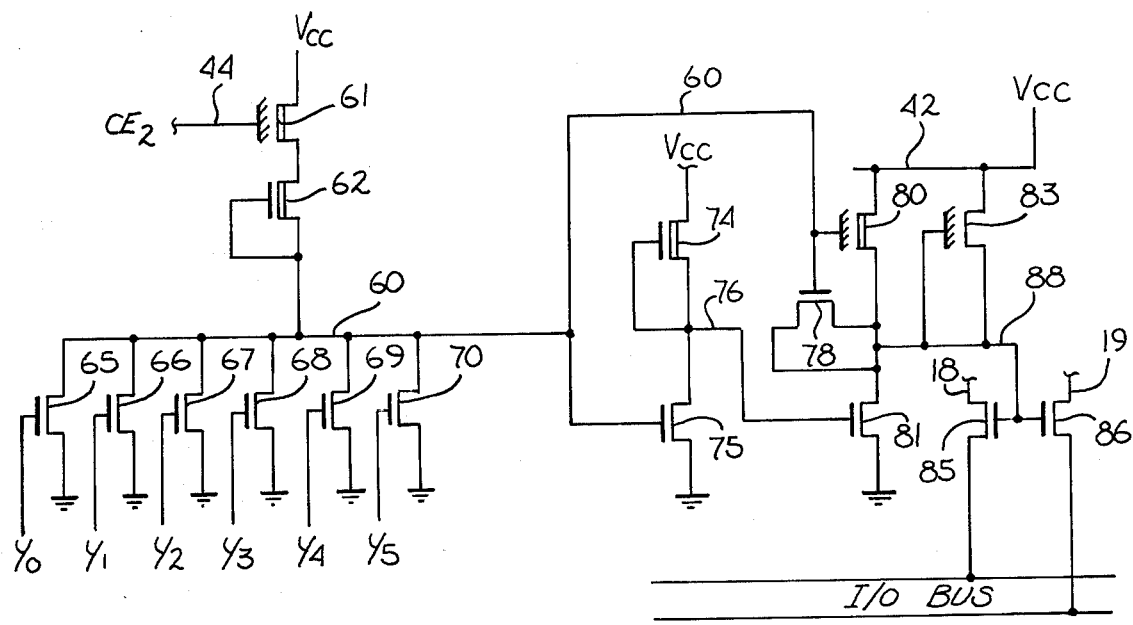
Fig. 4  Y DECODER
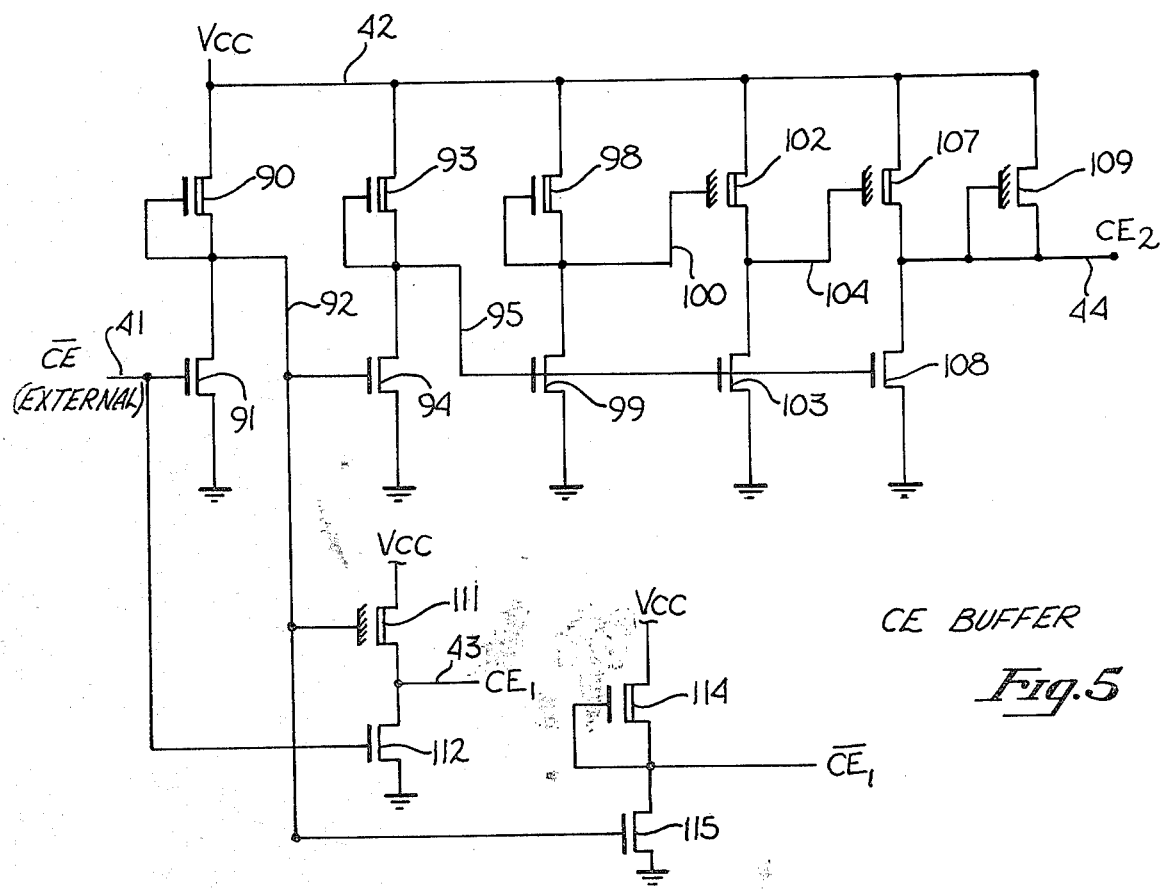
CE BUFFER
Fig. 5

DATA-OUT BUFFER

LOW POWER/HIGH SPEED STATIC RAM

BACKGROUND OF THE INVENTION

1. Field of the Invention

The invention relates to the field of MOS RAMs.

2. Prior Art

Numerous MOS static and dynamic RAMs are commercially available. In some applications, mainly because of their lower power consumption, dynamic RAMs are favored over static RAMs even though they require refreshing. Most often the static RAMs provide faster access times; however, they dissipate more power.

Most static RAMs employ bistable circuits (such as flip-flops) as memory cells for storing binary ones and binary zeros. For these cells to store information, current must continually flow in one of the two cross-coupled circuit branches. In some cases, undoped polycrystalline silicon (polysilicon) is employed for loads (pull-ups) in these bistable circuits. Since the undoped polysilicon has a higher resistance than doped polysilicon or diffused resistors, power consumption is reduced.

In an attempt to reduce power consumption some static RAMs employ "clocked" peripheral circuits. That is, input-output buffers, decoders, read/write circuitry, and other peripheral circuits essentially operate as dynamic circuits to reduce power. These memories often have access limitations to accommodate the dynamic circuits.

In the presently preferred embodiment of the invented MOS RAM, static circuits are employed in a low power/ high speed memory. "Weak" depletion mode devices are used as loads in the memory cells. "Zero" threshold voltage devices are employed in peripheral circuits to permit the memory to be powered-down without affecting circuit performance. The use of the zero threshold devices and prior art means for powering-down static circuits are described in this patent in conjunction with FIG. 2A and FIG. 2B.

SUMMARY OF THE INVENTION

An integrated circuit, metal-oxide-semiconductor (MOS), static random-access memory (RAM) is described. The memory includes a plurality of enhancement mode and first depletion mode MOS devices. Second depletion mode devices which are less conductive than the first depletion mode devices are employed in the memory cells as loads. "Zero" threshold devices which have a threshold voltage of approximately zero volts are also employed. In addition to an input and output means for communicating with the cells, the memory includes power-down means for reducing the power consumed by the memory when the memory is in a standby mode. The input and output means employs the zero threshold devices to reduce current flow during the standby mode. In this manner, a lower power/higher speed RAM is realized.

BRIEF DESCRIPTION OF THE DRAWINGS:

FIG. 4 is a schematic of a Y-decoder employed in the memory of FIG. 1.

FIG. 5 is a schematic of the chip enable buffer employed in the memory of FIG. 1; and, FIG. 6 is a schematic of the output data buffer employed in the memory of FIG. 1.

DETAILED DESCRIPTION OF THE INVENTION:

An MOS static RAM is described. In the following description, numerous specific details, such as specific conductivity types, specific threshold voltages, etc., are given to provide a thorough understanding of the inventive concepts. It will be obvious to one skilled in the art that these inventive concepts may be employed in other embodiments. In other cases, well-known circuits have not been shown or have been shown in block diagram form in order not to obscure this disclosure in unnecessary detail.

In the presently preferred embodiment, the described memory is realized as a 4K (4096 bits) integrated circuit fabricated on a p-type silicon substrate employing n-channel field-effect devices with polysilicon gates. The TTL compatible memory is fabricated on a chip of approximately 130 × 190 mils and is organized as a 4K × 1 memory. Typical access times of approximately 45 nanoseconds are obtained with a power dissipation of 600 milliwatts (non-standby). During the standby mode, power dissipation is approximately 35 to 40 milliwatts.

Figure 1:
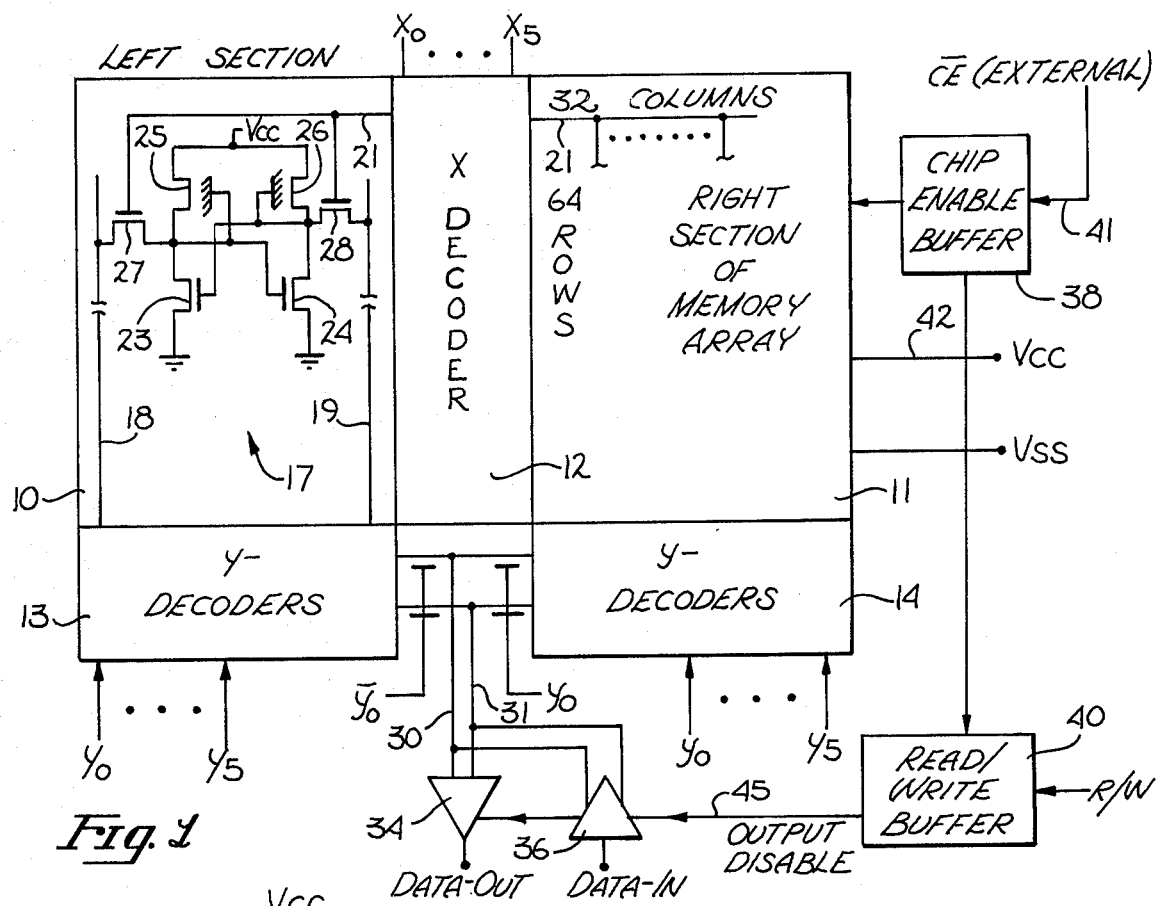
FIG. 1 is an overall block diagram illustrating the presently preferred embodiment of the invented RAM.

Referring to FIG. 1, the layout of the memory includes two memory sections, a left section 10 and a right section 11. These two memory sections are separated by the row or X-decoders 12. The X-decoders receive the address signals $X_0$ through $X_5$ and their complements from address buffers which are not illustrated.

Y-decoders are fabricated adjacent to the right and left memory sections; Y-decoders 13 are fabricated adjacent to the left section 10 and Y-decoders 14 are fabricated adjacent to the right section 11. The Y-decoders receive the address signals $Y_0$ through $Y_5$ and their complements from address buffers which are not illustrated. A Y-decoder shall be described in detail in conjunction with FIG. 4.

The memory, in its presently preferred embodiment, is packaged in an eighteen pin package. Twelve of these pins are used for the address signals, one pin is used for the data-in line which is coupled to a buffer 36, and another pin for the data-out line which is coupled to the output of buffer 34. (Buffer 34 is described in detail in conjunction with FIG. 6.) Another pin receives the read/write signal, which signal is coupled to the read/write buffer 40. Two pins are employed for power. The memory is powered by a single (external) five volt power source identified as $V_{CC}$, line 42. The memory ground, $V_{SS}$, is identified with the standard ground symbol in the drawings. Substrate biasing of approximately -3 volts is used; this biasing is generated "on chip" from the $V_{CC}$ supply. The remaining pin is coupled to the chip enable buffer 38 and receives the chip enable signal $\overline{(CE)}$, line 41. This buffer shall be described in detail in conjunction with FIG. 5.

A pair of complementary (push-pull) input/output lines 30 and 31 are selectively coupled to the Y-lines or column lines in the memory array through the Y-decoders 13 and 14. The $Y_0$ and $\overline{Y}_0$ address signals as illustrated in FIG. 1 are used to couple this input/output, bidirectional data bus with either the right section or left section of the memory. The lines 30 and 31 are coupled to the input of the data-out buffer 34 and to the output of the data-in buffer 36.

The memory is fabricated employing a plurality of field-effect transistors. Four different transistor types are employed; each of these types has a different threshold voltage. The specific process employed in the presently preferred embodiment for obtaining the different transistors is disclosed in a copending application Ser. No. 700,043, filed July 28, 1976, entitled, "MOS Process" and assigned to the assignee of this patent now U.S. Pat. No. 4,052,229. This process employs a high resistivity p-type silicon substrate (50 ohm-cm) which results in high mobility devices with low body effect.

One transistor type employed in the memory is an enhancement mode transistor having a threshold voltage of approximately 0.6 to 0.9 volts. This transistor is illustrated in the drawings by the standard field-effect symbol, such as transistors 23 and 24 of FIG. 1. The second type transistor employed in the memory is a depletion mode transistor having a threshold voltage of between approximately −2.5 to −3.0 volts. The symbol designation used in the drawings for this transistor is shown by transistor 62 of FIG. 4. A second depletion mode transistor having a threshold voltage of between −1.2 to −1.8 volts is also employed. The transistor symbol employed for this device is shown by transistors 25 and 26 of FIG. 1. This "weak" depletion mode device has lower conductance than the first mentioned depletion mode transistor. The last transistor type employed in the memory has a voltage threshold approximately equal to 0 volts (typically in the range of −0.3 to +0.2 volts for the specific process employed). This device shall be referred to as the "zero" threshold transistor or device in this patent since its voltage threshold is approximately equal to zero volts. The symbol designation for this device is shown by transistor 55 of FIG. 2B.

The channel regions of the zero threshold devices employ the substrate without any further doping. The channel regions of the first depletion mode transistors are arsenic implanted to a dopant level of approximately $0.8 \times 10^{12}$ atoms/cm$^2$. To obtain the threshold for the enhancement mode transistors, a boron dopant is employed in the channel regions of these transistors. A dopant level of approximately $0.3 \times 10^{12}$ atoms/cm$^2$ is used. The channel regions of the weak depletion mode transistors are doped with both the arsenic and boron dopants.

Figure 2A:
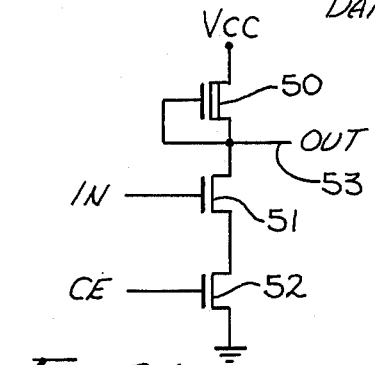
FIG. 2A illustrates a prior art static inverter which includes a transistor for powering-down the inverter.

Referring briefly to FIG. 2A, a prior art circuit used to power-down static memories is shown and includes a depletion mode transistor 50 coupled in series with enhancement mode transistors 51 and 52. The input to this inverter circuit is applied to the gate of transistor 51. A chip enable or like signal is applied to the gate of the transistor 52. The output line 53 is coupled to the junction between transistors 50 and 51. A positive potential (assuming an n-channel embodiment) is applied to the gate of transistor 52 when the circuit is in operation. This allows the circuit to operate in a somewhat ordinary manner for an inverter. One problem with this circuit is that line 53 may not easily be brought to ground potential because of the voltage drop across transistor 52. To power-down the circuit, the potential on the gate of transistor 52 is brought to ground, thereby interrupting the current path from $V_{CC}$ to ground.

Figure 2B:
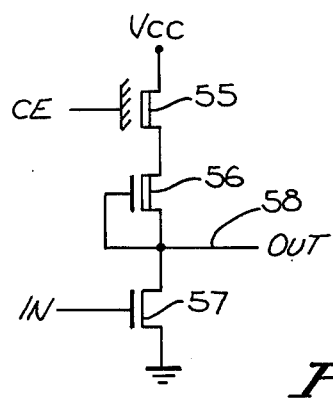
FIG. 2B illustrates an inverter employed in the memory of FIG. 1 which may be powered-down.

In contrast to the circuit of FIG. 2A the presently preferred embodiment of the memory employs the circuit of FIG. 2B in some instances to power-down the memory. This circuit includes a zero threshold transistor 55 coupled in series with a depletion mode transistor (load) 56 and an enhancement mode transistor 57. The output of this inverter (line 58) is sensed between transistors 56 and 57. The enabling signal is applied to the gate of transistor 55; the input signal is applied to the gate of transistor 57. With this inverter line 58 may be more readily brought to ground potential through transistor 57 since a transistor equivalent to transistor 52 of FIG. 2A is not employed. Moreover, line 58 may be raised substantially to $V_{CC}$ since the threshold voltage of transistor 55 is substantially zero. Note that since the substrate exhibits a low body-effect, the threshold voltage of transistor 55 is substantially independent of the voltage of its source/drain terminals relative to the substrate. The circuit of FIG. 2B was first described in a copending application entitled, "Electrically Programmable MOS Read-Only Memory", Ser. No. 728,789, filed Oct. 1, 1976, and asisgned to the assignee of this patent. Several improved circuits employing zero threshold devices are described in this patent.

Referring again to FIG. 1, each section 10 and 11 of the memory includes 16 (32) pairs of column lines such as column lines 18 and 19 which are coupled to the Y-decoders 13. Sixty-four (64) X-lines or row lines such as line 21 are coupled to the X-decoders. A memory cell is formed at the junction of each of the X-lines and pairs of Y-lines. One such cell 17 is shown coupled to column lines 18 and 19, and the row line 21.

Cell 17 is a bistable circuit which includes two cross-coupled branches. One branch includes a weak depletion mode transistor 25 coupled in series with an enhancement mode transistor 23. The other branch includes a weak depletion mode transistor 26 coupled in series with the enhancement mode transistor 24. The common junction between transistors 23 and 25 is coupled to line 18 by transistor 27; the common junction between transistors 24 and 26 is coupled to line 19 by transistor 28. The gates of transistors 27 and 28 are coupled to the row line 21. The state of the bistable circuit may be sensed on lines 18 and 19 when a positive potential is applied to line 21 by the X-decoders. Also, the state of this bistable circuit may be changed by applying potentials to lines 18 and 19, again when a positive potential is applied to line 21. By employing the weak depletion mode transistors 25 and 26 as loads, the memory cells consume considerably less power than if an ordinary depletion mode transistor were employed.

Referring to FIG. 4, one Y-decoder of Y-decoders 13 or 14 of FIG. 1 is shown. This Y-decoder receives the $Y_0$ through $Y_5$ address signals which are coupled to the gates of the enhancement mode transistors 65 through 70, respectively. (The other Y-decoders receive different combinations of $Y_0$–$Y_5$ and $\overline{Y}_0$–$\overline{Y}_5$ as in the common practice.) The drain terminals of transistors 65 through 70 are coupled to node 60. Node 60 coupled to the $V_{CC}$ potential through a depletion mode transistor 62 and a zero threshold transistor 61. The gate of transistor 61 receives a timing signal, $CE_2$, on line 44. The gate of the transistor 62 is coupled to node 60.

The output circuitry of the decoder of FIG. 4 includes an inverter comprising the depletion mode transistor 74 coupled in series with the enhancement mode transistor 75. Node 60 is coupled to the gate of transistor 75. The gate of transistor 74 (node 76) is coupled to the common junction between transistors 74 and 75. Transistors 80 and 81 are coupled in series between $V_{CC}$ and ground. The gate of the zero threshold transistor 80 is coupled to node 60; the gate of transistor 81 is coupled to node 76. A capacitor 78 is disposed between the common junction between transistors 80 and 81 (node 88) and node 60. Node 88 is coupled to the gates of transistors 85 and 86 and to the gate and source terminal of transistor 83. Transistors 85 and 86 are employed to select column lines in the memory array such as lines 18 and 19 (also shown in FIG. 1) and to couple these lines to the input/output (I/O) bus.

It is desirable to power-down the decoder of FIG. 4 during the standby mode. For this reason, transistor 61 is employed to decouple node 60 from $V_{CC}$. While this zero threshold device has substantially no voltage drop there is some drop associated with it. In most instances this drop may be ignored. For example, again referring to the circuit of FIG. 2B, where the output line 58 is coupled to the gate of an enhancement mode transistor of a next stage, a potential of 1.5 volts is ample to drive this transistor. However, in some instances, the full $V_{CC}$ potential is required. In the case of the Y-decoders the full $V_{CC}$ potential applied to the gates of the column selection transistors (such as transistors 85 and 86) assures transfer of the sensed potential at the memory cells to the input/output bus. As will be described the output circuitry of the decoder of FIG. 4 assures that the full $V_{CC}$ potential is applied to the gates of transistors 85 and 86.

Assume for sake of discussion that the Y-decoder of FIG. 4 has been selected by the address signals. Such selection occurs when all the address signals applied to the decoder are low, thereby allowing node 60 to rise in potential from the current supply through transistors 61 and 62. Prior to the time that node 60 rises in potential, node 76 is coupled to $V_{CC}$ through transistor 74 since transistor 75 is not conducting. Consequently, transistor 81 conducts, coupling one terminal of the capacitor 78 to ground. As the potential on node 60 rises, capacitor 78 is charged from node 60. The inverter comprising transistors 74 and 75 is relatively slow in operation. Thus, even as node 60 rises in potential, transistor 75 does not immediately conduct. The predetermined delay introduced by transistors 74 and 75 is sufficient to allow capacitor 78 to charge.

The potential on node 60 causes transistor 80 to conduct. This relatively large transistor raises node 88 towards $V_{CC}$ causing the selection transistor 85 and 86 to turn-on.

As the potential on node 60 continues to rise, transistor 75 conducts bringing node 76 close to ground potential. This, in turn, causes transistor 81 to cease conducting. When this occurs, node 60 is bootstrapped by capacitor 78 driving the potential on node 60 higher than $V_{CC}$. Consequently, transistor 80 conducts heavily, bringing node 88 to $V_{CC}$. Note that node 60 is able to rise in potential above $V_{CC}$ since transistor 61 cuts-off when the potential on its source terminal rises above the $CE_2$ potential. (The $CE_2$ is approximately equal to $V_{CC}$). The weak depletion mode transistor 83 is a relatively small device employed to maintain node 88 at $V_{CC}$. This device supplies the "leakage" current for node 88.

During the power-down mode the $CE_2$ signal is low, therefore, no current is supplied to node 60. This prevents transistor 80 from conducting which substantially reduces the power consumed by the Y-decoders during standby. Thus the bootstrapping along with the zero threshold transistors allow the Y-decoders to be easily powered-down; however, these circuits provide an output potential equal to $V_{CC}$.

In the presently preferred embodiment the X-decoders include a plurality of transistors such as transistors 65 through 70 of FIG. 4 along with transistors equivalent to transistors 61 and 62. The remainder of the circuitry shown in FIG. 4 is not employed for the X-decoders since the voltage drop associated with the zero threshold transistor 61 is not sufficient to require boostrapping for the row lines.

Referring now to FIG. 5 the chip enable buffer 38 of FIG. 1 is shown in detail. The input to this buffer is the $\overline{CE}$ signal, line 41, which is coupled to the gates of the enhancement mode transistors 91 and 112. The output signals from this buffer are the $CE_1$ signal, line 43; the $\overline{CE}_1$ signal; and the $CE_2$ line 44.

The $\overline{CE}$ signal is applied to the inverter comprising the depletion mode transistor 90 and transistor 91. The output of this inverter, node 92, is coupled to a second inverter which comprises the depletion mode transistor 93 and an enhancement mode transistor 94. This node is also coupled to the gate of the zero threshold transistor 111 and the gate of the enhancement mode transistor 115. The output of this second inverter, node 95, is coupled to the gates of enhancement mode transistors 99, 103 and 108. The inverter comprising the depletion mode transistor 98 and the enhancement mode transistor 99 has its output, node 100, coupled to the gate of the zero threshold transistor 102. Transistor 102 is coupled in series with transistor 103. The common terminal between transistors 102 and 103, node 104, is coupled to the gate of the zero threshold transistor 107. This transistor is coupled in series with transistor 108. The common junction between these transistors, line 44, is coupled to the gate and source terminal of the weak depletion mode transistor 109.

The $CE_1$ signal is developed from transistors 111 and 112 which are coupled in series between $V_{CC}$ and ground. Line 43 is coupled to the common junction between these transistors. The $\overline{CE}_1$ signal is developed by the inverter comprising transistors 114 and 115.

The static buffer of FIG. 5 is used to activate the peripheral circuits of the memory when the $\overline{CE}$ signal drops in potential. This buffer also controls the power-down or standby mode when the $\overline{CE}$ signal is in its upper state. The $CE_2$ signal drives a relatively larger load in the memory, when compared to the $CE_1$ and $\overline{CE}_1$ signals. The $CE_2$ signal reaches a potential of approximately 5 volts in approximately 9 nanoseconds after the $\overline{CE}$ signal drops in potential. The $CE_1$ and $\overline{CE}_1$ are employed as a "early wakeup" for some of the peripheral circuits, and in particular, for the address buffers. As will be seen, the buffer of FIG. 5, unlike many other buffers, has no critical off-time, thus there are no limitations on accessing the memory associated with this buffer.

Referring to the $CE_2$ path of the buffer of FIG. 5, the inverter comprising transistors 93 and 94 receives the CE signal and inverts this signal in an ordinary manner. However, the output of this inverter is employed to drive the next three stages of the buffer, specifically the gates of transistors 99, 103 and 108. The inverter comprising transistors 98 and 99 also operates in a normal manner. The size of the transistors employed in this stage are larger than the transistors employed in the previous stage to obtain more driving power for the remaining stages of the buffer. The stage comprising transistors 102 and 103 includes a driven load; the output of the previous inverter stage, node 100, is employed to drive the load transistor 102. Transistor 102 is a relatively large transistor with a Z/L ratio of 140/5.5 in the presently preferred embodiment. This transistor, as may be seen, is used to drive the gate of the output transistor 107. Since transistor 102 is large, a substantial overdrive is provided to the gate of transistor 107. This assures that the gate of the output transistor 107 is quickly driven positive.

There is also a bootstrapping effect on the gate of transistor 107 as node 104 rises in potential. This bootstrapping occurs because of the substantial parasitic capacitance between the gate of transistor 107 and the output line 44. Node 104 is able to rise in potential above $V_{CC}$ since the zero threshold transistor 102 cuts-off as node 104 rises in potential. The output transistor 107 in the presently preferred embodiment has a Z/L ratio of 550/6. Transistor 109 is employed to furnish a leakage current to line 44, thus this transistor is relatively small (8/16).

The input $\overline{CE}$ signal is first inverted to a CE signal at node 92, thus when the CE signal is high, node 95 is low causing transistors 99, 103 and 108 to cease conducting. This allows nodes 100 and 104 and the output line 44 to rise in potential.

The CE signal on node 92 drives the zero threshold transistor 111 allowing line 43 to rise to a potential substantially equal to $V_{CC}$. Also this signal causes transistor 115 to conduct thereby providing the $\overline{CE_1}$ signal.

Figure 6:
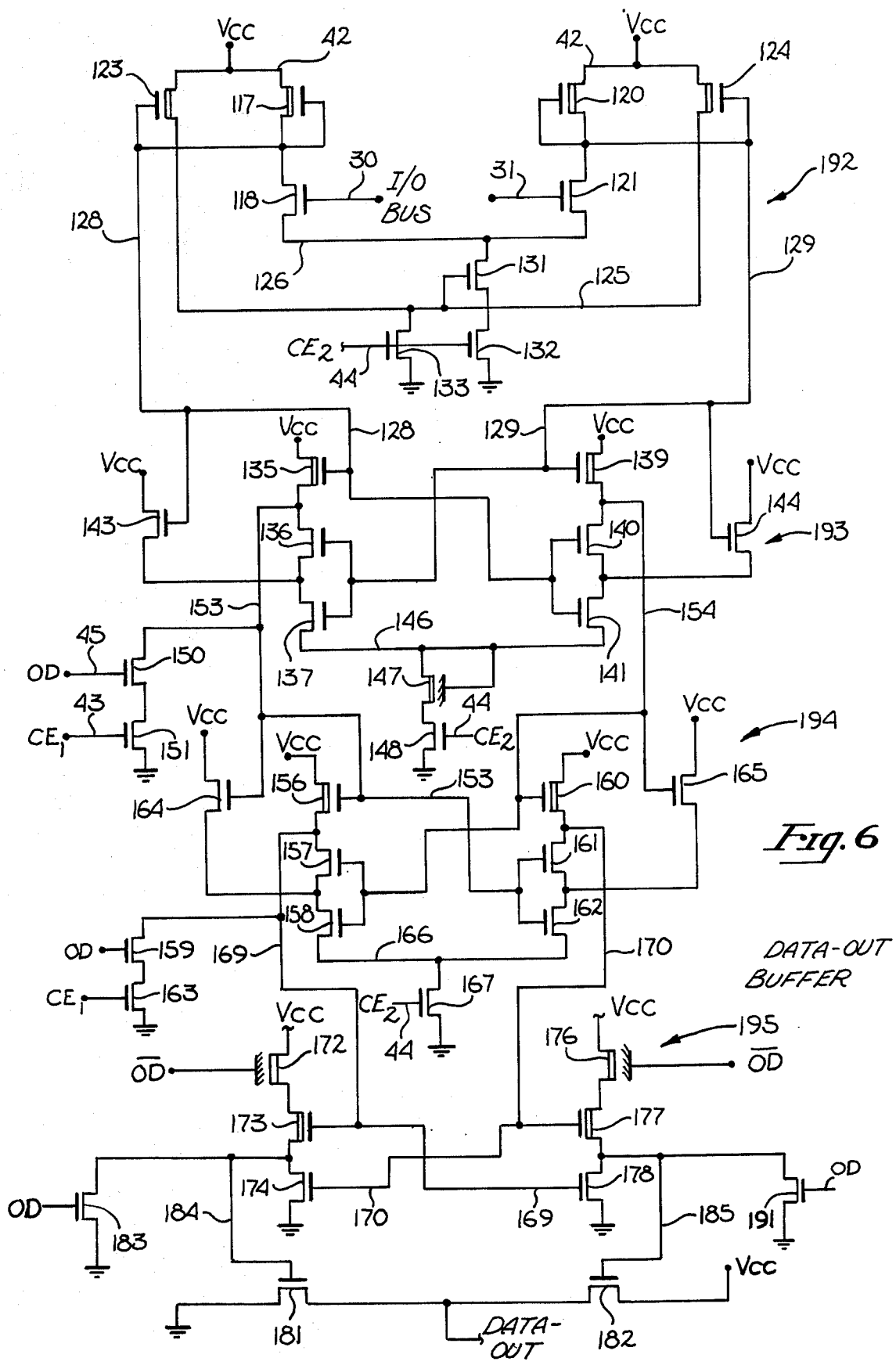

Referring now to the data-out buffer of FIG. 6, the buffer includes an input stage 192, two cross-coupled Schmitt trigger stages 193 and 194, a push-pull driver stage 195, and a pair of output transistors 181 and 182. The output from the driver stage is sensed between transistors 181 and 182. The input to this buffer is the input/output bus, lines 30 and 31 which are coupled to the gates of transistors 118 and 121, respectively.

The input stage 192 includes a pair of inverters comprising transistors 117 and 118 and transistors 120 and 121. The source terminals of transistors 118 and 121 are coupled to ground through transistors 131 and 132. The depletion mode transistor 117 has its gate and source terminal coupled to line 128, which is one output line for the input stage. This line is also coupled to the gate of the depletion mode transistor 123. Similarly, the depletion mode transistor 120 has its gate and source terminal coupled to the other output line of the input stage, line 129. This line is common with the gate of the depletion mode transistor 124. The transistors 123 and 124 are coupled to node 125. This node is coupled to ground through transistor 133. The gates of transistors 132 and 133 are coupled to the source of the $CE_2$ signal to power-down the input stage 192.

The first Schmitt trigger stage 193 includes transistors 135, 136 and 137 coupled in series between $V_{CC}$ and node 146. Similarly, transistors 139, 140 and 141 are coupled between $V_{CC}$ and node 146. Node 146 is coupled to ground through transistors 147 and 148. The zero threshold transistor 147 has its gate coupled to node 146; the gate of transistor 148 is coupled to line 44, the source of the $CE_2$ signal in order that this stage may be powered-down. One input line to this stage, line 128, is coupled to the gate of the depletion mode transistor 135, the gate of the enhancement mode transistor 143; this line is also cross-coupled to the gates of transistors 140 and 141. Similarly, the other output line 129 is coupled to the gate of the depletion mode ransistor 139, the gate of enhancement mode transistor 144, and cross-coupled to the gates of transistors 136 and 137. Transistor 143 is coupled between $V_{CC}$ and the common junction between transistors 136 and 137. Likewise, transistor 144 is coupled between $V_{CC}$ and the common junction between transistors 140 and 141. One output line from this stage, line 153, is coupled between transistors 135 and 136 of the next stage 194. The other output line, line 154, is coupled between transistors 139 and 140.

Stage 193 includes the series coupled transistors 150 and 151 which are coupled between line 153 and ground. The gate of transistor 150 is coupled to line 45. This line receives the "output disable" signal. Transistor 151 receives the $CE_1$ signal, line 43. As will be described transistors 150 and 151 are employed to establish an initial condition for this Schmitt trigger stage.

The second Schmitt trigger stage 194 includes transistors 156, 157 and 158 coupled in series between $V_{CC}$ and node 166. Similarly, transistors 160, 161 and 162 are coupled in series between $V_{CC}$ and this node. Node 166 is coupled to ground through transistor 167. The gate of this transistor is coupled to line 44 to power-down this stage. One input line to this stage, line 153, is coupled to the gate of the depletion mode transistor 156, the gate of transistor 164 and cross-coupled to the gates of transistors 161 and 162. In a similar fashion, the other input line 154 is coupled to the gate of the depletion mode transistor 160, the gate of transistor 165 and cross-coupled to the gates of transistors 157 and 158. Transistor 164 is coupled between $V_{CC}$ and the common junction between transistors 157 and 158. Likewise, transistor 165 is coupled between $V_{CC}$ and the common junction between transistors 161 and 162. One output line from this stage, line 169, is coupled between transistors 156 and 157. The other output line 170, is coupled between transistors 160 and 161. This stage also includes the series coupled transistors 159 and 163 which are employed to establish the initial condition of this second Schmitt trigger stage. These transistors are coupled between line 169 and ground. The gate of transistor 159 receives the output disable signal; the gate of transistor 163 receives the $CE_1$ signal.

The push-pull driver stage 195 includes the series coupled transistor 172, 173 and 174 coupled between $V_{CC}$ and ground. Similarly, transistors 176, 177 and 178 are coupled between $V_{CC}$ and ground. The gates of the zero threshold transistors 172 and 176 receive the complement of the output disable signal. One input line 196 to this stage is coupled to the gate of the depletion mode transistor 173 and cross-coupled to the gate of transistor 178. The other input line 170 is coupled to the gate of the depletion mode transistor 177 and cross-coupled to the gate of transistor 174.

The output transistors 181 and 182 are coupled between $V_{CC}$ and ground. The gate of transistor 181, line 184, is coupled to the common terminal between transistors 173 and 174. Similarly, the gate of transistor 182, line 185, is coupled to the common terminal between transistors 177 and 178. Lines 184 and 185 are coupled to ground through transistors 183 and 191, respectively. The gates of these transistors receive the OD signal.

In general the data-out buffer of FIG. 6 operates as a differential amplifier. When the state of a memory cell is sensed, one of the lines 30 and 31 rises in potential while the other drops in potential. This potential difference is sensed by the pair of input inverters of stage 192 comprising transistors 117 and 118, and transistors 120 and 121. Transistor 132 is employed to decouple node 126 from ground, thereby preventing a flow of current through these two input inverters during the power-down mode. Transistors 123 and 124 provide a DC bias to node 125. This DC bias modulates the potential on the gate of transistor 131 to provide compensation for both process variations and changes in the power supply potential ($V_{CC}$).

The stages 193 and 194 operate in an ordinary manner for a cross-coupled Schmitt trigger and provides amplification for the output of stage 192. Stage 193, unlike stage 194, includes a zero threshold transistor 147 coupled between node 146 and the drain terminal of transistor 148. The gate of this transistor is also coupled to node 146, thus this transistor effectively operates as a resistive load. Transistor 147 is employed to compensate for the voltage swing of the input signal to this stage. This input signal does not vary between zero volts and $V_{CC}$, but rather, by way of example, between approximately two volts and $V_{CC}$. Since the input to stage 194 is amplified and varies, by way of example, between one volt and $V_{CC}$, a transistor equivalent to 147 is not required for stage 194.

The outputs of stage 194 drive the push-pull driver stage 195. This stage is powered-down during the power-down mode by the $\overline{OD}$ signal. (Both the OD signal and $\overline{OD}$ signal are generated by the read/write buffer 40 of FIG. 1. This buffer generates this output disable signal from the R/W signal and outputs from the chip enable buffer.) When the output is disabled, transistors 172 and 176 do not conduct, thereby conserving power in stage 195.

The output of stage 195, lines 184 and 185, drive the output transistors 181 and 182, respectively. It should be noted that if both transistors 181 and 182 simultaneously conducted, a short circuit occurs between $V_{CC}$ and ground. For this reason, means are provided to initially set the buffer of FIG. 6 during reading in one state to assure that only one of the transistors 181 and 182 conducts. In the presently preferred embodiment, during reading, the buffer is initially set such that transistor 182 conducts, thereby raising the data-out line to $V_{CC}$ less the threshold voltage of transistor 182. In general the potential on a line may be lowered more quickly than raised, thus the data-out line is raised in potential rather than initially set at ground potential. In this manner the data-out line may more quickly be set into the binary state sensed at lines 30 and 31 (I/O bus lines).

Before describing the manner in which the buffer of FIG. 6 is initially set, it is necessary to understand the relative timing of the OD, $\overline{OD}$, $CE_1$, and $CE_2$ signals. The $\overline{OD}$ signals only rise in potential during memory reading (read cycle), thus during writing and the power-down mode the relatively large transistors 174 and 178 are decoupled from $V_{CC}$. Moreover, during writing and power-down the OD signal is positive preventing the large output transistors 181 and 182 from conducting since their gates are coupled to ground through transistors 183 and 191, respectively. During reading both the $CE_1$ and $CE_2$ signals rise in potential before the output is enabled, that is, before $\overline{OD}$ rises in potential and OD drops in potential.

Stages 193 and 194 are set in a predetermined state when the memory is enabled. Transistors 150 and 151, and transistors 159 and 163 are employed for this purpose. When the chip is enabled the "early wakeup" timing signal $CE_1$ along with the OD signal cause lines 153 and 169 to be coupled to ground through transistors 150 and 151, and transistors 159 and 163, respectively. With lines 153 and 169 coupled to ground, line 170 is high. When the $\overline{OD}$ signal rises in potential and the OD signal drops in potential, transistors 174 and 177 conduct. This will raise line 185 to approximately $V_{CC}$ causing transistor 182 to conduct. Note that once the OD signal drops in potential, the state of Schmitt trigger stages 193 and 194 will be governed by the signal sensed on lines 30 and 31.

In the presently preferred embodiment, the output of the chip enable buffer is employed to power-down the memory. The address buffers and other circuits, not illustrated, in addition to the illustrated circuits are decoupled from $V_{CC}$ or ground by the $CE_1$ and $CE_2$ signals to conserve power in the memory during the power-down mode. Thus the $\overline{CE}$ signal and the CE buffer are employed as a means for powering-down and powering-up the memory.

Also during the standby mode, all the outputs of the address buffers are high. This prevents the selection of any row or column lines in the memory array further reducing power consumption.

Figure 3:
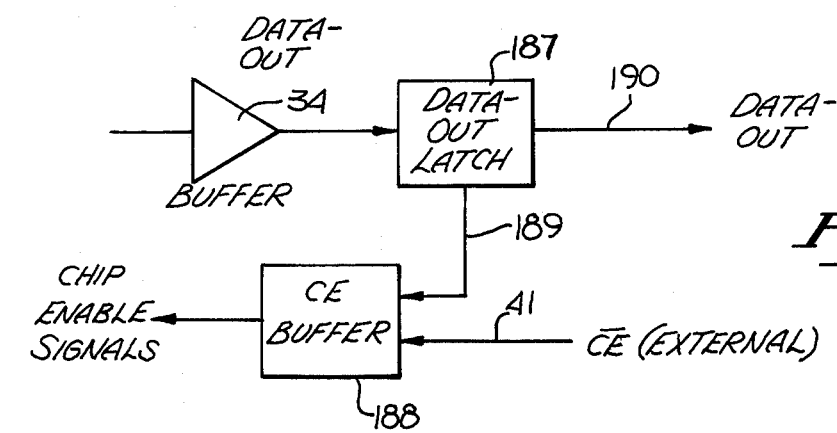
FIG. 3 is a block diagram of an alternate means for initiating the power-down mode in the memory of FIG. 1.

Referring now to FIG. 3, an alternate means for initiating the power-down or standby mode is illustrated. In this figure, the data-out buffer 34 of FIGS. 1 and 6 is again illustrated. However, for this alternate embodiment the output of the data-out buffer is coupled to a data-out latch 187. This latch is employed to receive the data from the buffer 34 and to store this data. The data output line 190 provides the output data from the memory for this embodiment. When the data-out latch 187 receives data from the buffer 34, it couples a signal on line 189 to the chip enable buffer 188. This signal causes the chip enable signals, specifically the $CE_1$ and $CE_2$ signals, to drop in potential even though the externally applied $\overline{CE}$ signal may be low. Thus, with this embodiment, the chip is automatically powered-down during reading once data is delivered to the latch 187. However, this embodiment requires that the $\overline{CE}$ signal (or some other means) be employed to reactivate the memory.

Referring again to FIG. 1 the memory operates in an ordinary manner for a random-access memory with the exceptions previously discussed. The input data is coupled from buffer 36 to the I/O bus comprising lines 30 and 31 and then into either the left section 10 or right section 11 of the memory array. Simiarly, output data is coupled from either section 10 or 11 to the data-out buffer 34. The address signals are employed in an ordinary manner to select a single cell in either the right or left section of the memory array during reading and writing. Information is written into the cells by "overpowering" the column lines, such as columns 18 and 19.

Thus, a high speed, low power, static random-access memory has been described. Zero threshold transistors are employed in conjunction with the power-down circuitry to power-down the memory. During the power-down mode, the power consumption of the memory is reduced by a factor greater than 10.

We claim:

1. An integrated circuit, metal-oxide-semiconductor (MOS), random-access static memory comprising:
   a plurality of bistable memory cells;
   input and output means for communicating with said memory cells;
   power-down means for reducing the power consumed by said memory when said memory is in a standby mode, coupled to said input and output means;

said memory including a plurality of enhancement mode MOS device, a first plurality of depletion mode MOS devices, a second plurality of depletion mode MOS devices, said second plurality of depletion mode MOS devices being less conductive than said first plurality, and a plurality of low threshold MOS devices, said low threshold MOS devices having a threshold voltage of approximately zero volts;

said memory cells including in series one of said enhancement mode MOS devices and one of said second plurality of depletion mode MOS devices, said depletion mode device being employed as a load;

said input and output means employing a plurality of said low threshold MOS devices coupled to receive a signal from said power-down means to reduce current flow in said input and output means during standby mode, said low threshold MOS devices coupled in series with said enhancement mode devices and said first depletion mode devices;

whereby said memory is a fast random-access, static memory having low power consumption.

2. The memory defined by claim 1 wherein said power-down means includes a buffer which receives an external signal and which provides an enabling signal for said memory, said enabling signal coupled to said plurality of said low threshold devices of said input and output means.

3. The memory defined by claim 2 wherein said memory cells are arranged in two sections each of which include 64 row lines and 32 pairs of column lines.

4. The memory defined by claim 2 wherein said input and output means includes a latch means for receiving output data from said memory, said latch means providing a signal to said buffer to initiate said standby mode once data is received by said latch means.

5. The memory defined by claim 1 wherein said input and output means includes a plurality of Y-decoders which couple selected column lines with a bidirectional data bus.

6. The memory defined by claim 5 wherein each of said Y-decoders includes bootstrapping means for bootstrapping the gate of one of said low threshold devices.

7. The memory defined by claim 1 wherein said input and output means includes a data-out buffer which is selectively coupled to said memory cells.

8. The memory defined by claim 7 wherein said data-out buffer comprises a bistable, differential circuit.

9. The memory defined by claim 8 wherein said data-out buffer includes means for pre-setting said buffer in one of two stable states when said buffer is activated.

10. The memory defined by claim 9 wherein the output of said data-out buffer is high when said buffer is preset.

* * * * *